US012771093B2

(12) United States Patent
Itabashi et al.

(10) Patent No.: US 12,771,093 B2
(45) Date of Patent: Oct. 20, 2026

(54) OPTICAL MODULE AND MANUFACTURING METHOD OF OPTICAL MODULE

(71) Applicant: SUMITOMO ELECTRIC INDUSTRIES, LTD., Osaka (JP)

(72) Inventors: Naoki Itabashi, Osaka (JP); Kosuke Sekiguchi, Osaka (JP); Michio Suzuki, Osaka (JP); Tomoya Saeki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 661 days.

(21) Appl. No.: 18/321,818

(22) Filed: May 23, 2023

(65) Prior Publication Data

US 2023/0387651 A1 Nov. 30, 2023

(30) Foreign Application Priority Data

May 31, 2022 (JP) ................................ 2022-088998

(51) Int. Cl.
*H01S 5/02315* (2021.01)
*H01S 5/02212* (2021.01)
*H01S 5/0231* (2021.01)

(52) U.S. Cl.
CPC ...... *H01S 5/02315* (2021.01); *H01S 5/02212* (2013.01); *H01S 5/0231* (2021.01)

(58) Field of Classification Search
CPC . H01S 5/02315; H01S 5/02212; H01S 5/0231
See application file for complete search history.

(56) References Cited

U.S. PATENT DOCUMENTS

2005/0121684 A1* 6/2005 Aruga .................. G02B 6/4292 257/98
2016/0006210 A1 1/2016 Noguchi et al.
2018/0145759 A1 5/2018 Kasai

FOREIGN PATENT DOCUMENTS

JP 2016-018862 A 2/2016
JP 2018-082117 A 5/2018

* cited by examiner

*Primary Examiner* — Yuanda Zhang
(74) *Attorney, Agent, or Firm* — McDonald Hopkins LLC

(57) ABSTRACT

An optical module includes an optical semiconductor element a stem including a signal pin and a ground pin; and a circuit board, the circuit board including a signal through-hole, a ground through-hole, a ground layer, and a junction part, the signal through-hole being configured to be pierced by the signal pin, the ground through-hole being configured to be pierced by the ground pin, the signal line being configured to be electrically connected with the signal pin, the ground layer being configured to be electrically connected with the ground pin, the junction part being configured to connect the assistance through-hole and the ground layer around the assistance through-hole with the stem. The circuit board has a first distance between the assistance through-hole and the signal through-hole, the first distance being smaller than a second distance between the ground through-hole and the signal through-hole.

13 Claims, 10 Drawing Sheets

OPTICAL MODULE AND MANUFACTURING METHOD OF OPTICAL MODULE

CROSS-REFERENCE TO RELATED APPLICATION

This application claims priority from Japanese Patent Application No. 2022-088998, filed on May 31, 2022, the entire subject matter of which is incorporated herein by reference

TECHNICAL FIELD

The present disclosure relates to an optical module and a method of making an optical module.

BACKGROUND

Japanese Unexamined Patent Application Publication No. 2016-18862 discloses an optical module and a method for manufacturing the optical module. The optical module includes an optical semiconductor element, a stein including a signal pin, a ground layer, and a substrate. The signal pin transmits an electrical signal to the optical semiconductor element and/or transmits an electrical signal output from the optical semiconductor element. The substrate has a first opening through which the signal pin passes and a junction part for joining the stein and the ground layer to each other. The junction part is formed at an end of the substrate or on a top surface of the substrate which the stein is disposed on.

Japanese Unexamined Patent Application Publication No. 2018-82117 discloses an optical module. The optical module includes an optical subassembly having a coaxial housing and a plurality of signal pins, a circuit board, and a flexible printed circuit (FPC) that connects the optical subassembly and the circuit board to each other. The circuit board provides a circuit for transmitting and receiving electrical signals to and from the optical subassembly on a main surface thereof. The FPC includes a ground pattern provided on the bottom surface and a signal line provided on the top surface.

SUMMARY

An optical module according to the present disclosure includes an optical semiconductor element; a stein including a signal pin extending in a first direction and a ground pin, the signal pin being electrically connected to the optical semiconductor element for transmitting an electrical signal, the ground pin being configured to provide a reference potential of the electrical signal; and a circuit board extending in a second direction crossing the first direction, the circuit board including a signal through-hole, a ground through-hole, a signal line extending in the second direction, a ground layer, an assistance through-hole provided within the stein in a planar view of the circuit board from the first direction, and a junction part, the signal through-hole being configured to be pierced by the signal pin, the ground through-hole being configured to be pierced by the ground pin, the signal line being configured to be electrically connected with the signal pin, the ground layer being configured to be electrically connected with the ground pin, the junction part being configured to connect the assistance through-hole and the ground layer around the assistance through-hole with the stein. The circuit board has a first distance between the assistance through-hole and the signal through-hole, the first distance being smaller than a second distance between the ground through-hole and the signal through-hole.

DETAILED DESCRIPTION

Details of Embodiments of Present Disclosure

Figure 1:
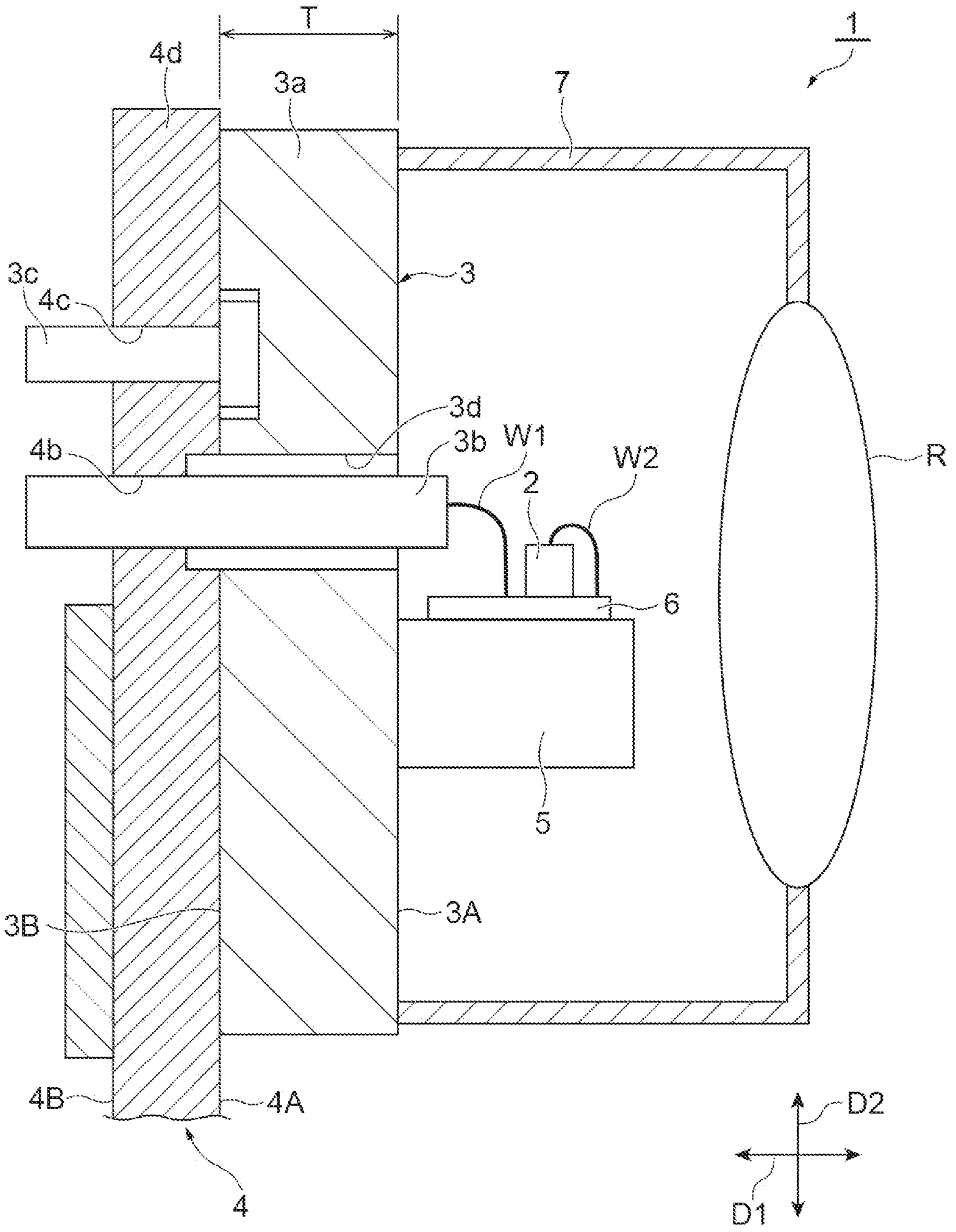
FIG. 1 is a schematic cross-sectional view illustrating a schematic configuration of an optical module according to a first embodiment.

Specific examples of optical modules according to embodiments of the present disclosure are described with reference to the drawings. In the description of the drawings, the same or corresponding elements are denoted by the same reference numerals, and redundant description is omitted as appropriate. The drawings may be partially simplified or exaggerated for ease of understanding, and dimensional ratios and the like are not limited to those illustrated in the drawings.

First Embodiment

FIG. 1 is a cross-sectional view showing a schematic configuration of an optical module 1 according to a first embodiment. As shown in FIG. 1, the optical module 1 includes an optical semiconductor element 2, a metal stein 3 including a signal pin (lead terminal) 3*b*, and a flexible printed circuit (FPC) 4 which is a circuit board having a signal through-hole 4*b* through which the signal pin 3*b* passes. The optical module 1 is, for example, an optical transmission module in which the optical semiconductor element 2 outputs an optical signal. The optical transmitter module includes, for example, a laser diode. The metal stein 3 has a disc-shaped main body 3*a*, and the main body 3*a* is made of metal.

The signal pin 3*b* has a columnar shape extending in a direction, the signal pin 3*b* passing through the main body 3*a* in the direction. The signal pin 3*b* transmits, for example, an electrical signal input to or output from the optical semiconductor element 2 between one surface and the other surface of the main body 3*a*. The signal pin 3*b* passes through the main body 3*a* to enable transmission of the electrical signal between one surface (inner surface) 3A and the other surface (outer surface) 3B. For example, the optical semiconductor element 2 is mounted on the one surface 3A and the FPC 4 is connected to the other surface 3B. The signal pin 3*b* is made of, for example, a conductive material. The signal pin 3*b* is made of, for example, metal. The signal pin 3*b* is inserted into a penetration hole 3*d* bored in the metal stein 3. The signal pin 3*b* is fixed to the main body 3*a* and insulated from the main body 3*a* by, for example, a glass material or the like provided between the signal pin 3*b* and the main body 3*a* in the penetration hole 3*d*. The signal through-hole 4*b* is provided so that the signal pin 3*b* protruding from the main body 3*a* can pass through the FPC 4. The signal through-hole 4*b* is also referred to as a through-hole.

As an example, the optical module 1 includes a block 5 fixed to the one surface (inner surface) 3A of the main body 3*a* and a substrate 6 mounted on the block 5, and the optical semiconductor element 2 is mounted on the substrate 6. The substrate 6 has, for example, high thermal conductivity. The substrate 6 is made of, for example, an insulating material having a linear expansion coefficient substantially equal to that of the optical semiconductor element 2. The substrate 6 is made of, for example, ceramic. The substrate 6 is also referred to as a carrier.

For example, the optical semiconductor element 2 is electrically connected to the signal pin 3*b* via the substrate 6 and a wire W1. More specifically, the substrate 6 provides a conductive wiring pattern, and the wire W1 is electrically connected between one end of the signal pin 3*b* to one end of the wiring pattern of the substrate 6. The optical semiconductor element 2 is electrically connected to the other end of the wiring pattern of the substrate 6 via, for example, a wire W2 different from the wire W1. Therefore, the signal pin 3*b* is electrically connected to the optical semiconductor element 2 via the wire W1, the wiring pattern, and the wire W2. As an example, a lens R is provided on the side opposite to the main body 3*a* when viewed from the optical semiconductor element 2, and the optical signal output by the optical semiconductor element 2 penetrates the lens R and is output to the outside of the optical module 1.

For example, the optical module 1 includes a cap 7. For example, the lens R is fixed to an opening of the cap 7. By fixing the cap 7 to the main body 3*a*, the position of the lens R with respect to the optical semiconductor element 2 is fixed. The metal stein 3 includes a signal pin 3*b* and a ground pin 3*c*. The signal pin 3*b* and the ground pin 3*c* pierce the FPC 4 in a first direction D1 which is a thickness direction of the FPC 4. The ground pin 3*c* is electrically connected to the main body 3*a*. Electrical connection of the ground pin 3*c* to a grounded wiring allows the main body 3*a* to be grounded. The ground pin 3*c* is preferably disposed near the signal pin 3*b* in order to electrically reinforce the ground related to transmission of a high-speed electrical signal to be described later. However, for example, the ground pin 3*c* may be arranged slightly away from the signal pin 3*b* due to the isolation from a different signal pin for another electrical signal or the configuration of the metal stein 3. The ground pin 3*c* is provided at a position offset from a centerline L1 shown in FIG. 2 toward an outer edge 3*g* of the metal stein 3 in the third direction D3. For example, the ground pin 3*c* may be provided between the outer edge 3*g* and the centerline L1 in the third direction D3. The ground pin 3*c* may be provided immediately above the centerline L1. The optical semiconductor element 2 may be hermetically sealed by connecting the cap 7 to the metal stein 3 for example by welding.

Figure 2:
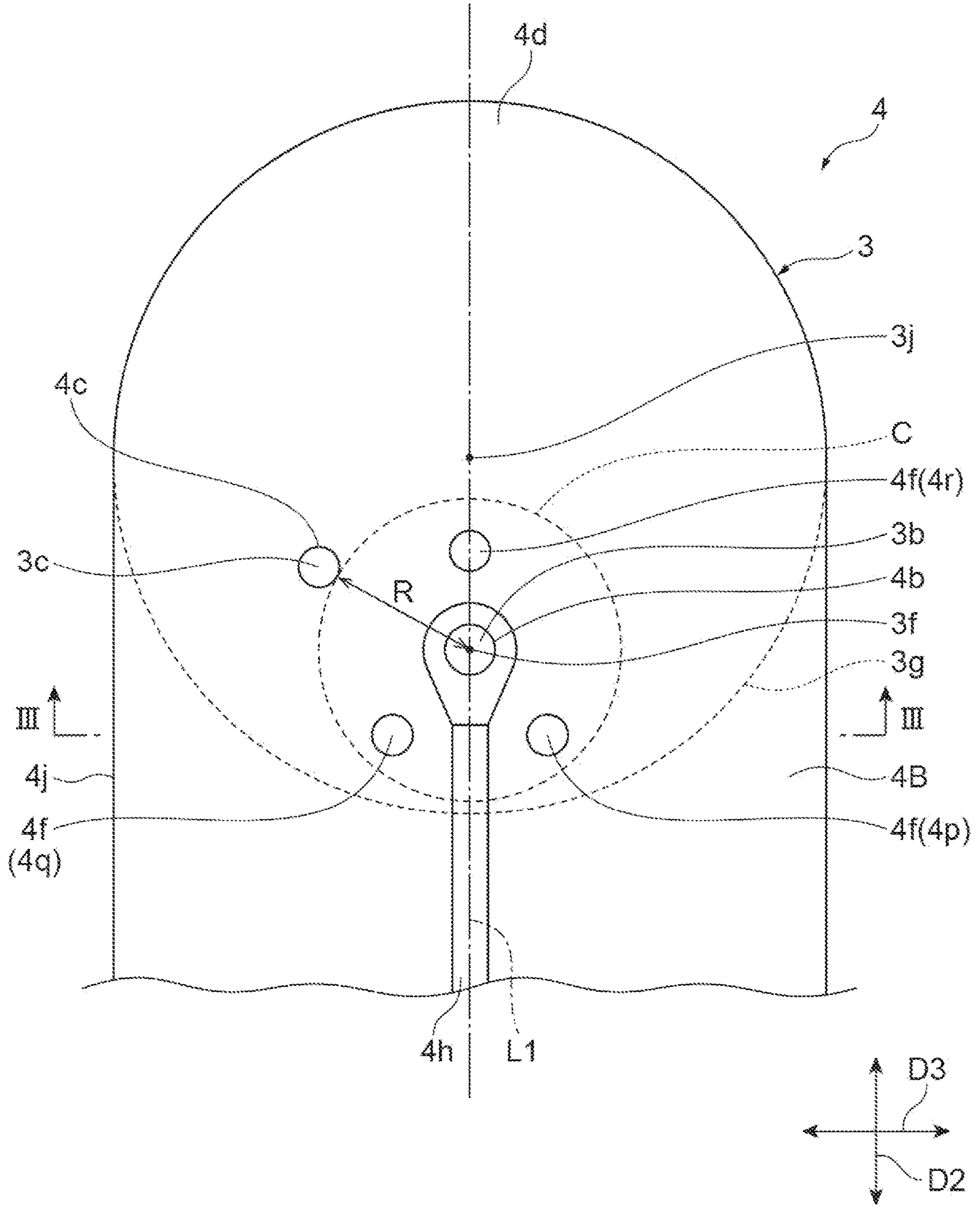
FIG. 2 is a plan view illustrating a bottom surface of an FPC of the optical module according to the first embodiment.

The FPC 4 has a top surface 4A and a bottom surface 4B facing away from the top surface 4A. The top surface 4A contacts the metal stein 3 and is fixed to the metal stein 3. More specifically, when the FPC 4 is attached to the metal stein 3, the top surface 4A is in contact with the outer surface 3B of the main body 3*a* opposite to the inner surface 3A. The signal pin 3*b* passes through the metal stein 3 along the first direction D1 from the inner surface 3A of the metal stein 3 toward the outer surface 3B of the metal stein 3. For example, one end of the signal pin 3*b* protrudes from the inner surface 3A of the metal stein 3 and is connected to a wire W1. The other end of the signal pin 3*b* protrudes from the outer surface 3B of the metal stein 3 to the outside and passes through the signal through-hole 4*b* in the FPC 4 along the first direction D1. FIG. 2 is a plan view showing the bottom surface 4B of FPC 4. As shown in FIGS. 1 and 2, the FPC 4 has a flat plate shape extending in a second direction D2 intersecting the first direction D1. The bottom surface 4B extends in the second direction D2 and the third direction D3. The third direction D3 intersects the first direction D1 and the second direction D2.

An end portion 4*d* of the FPC 4 in the second direction D2 is fixed to the metal stein 3. The end portion 4*d* includes a region where the top surface 4A contacts the outer surface 3B of the main body 3*a*. For example, when the FPC 4 is viewed from the first direction D1 (which is also referred to as a plan view of the FPC 4), the end portion 4*d* has a semicircular portion, and when the end portion 4*d* contacts and is fixed to the outer surface 3B of the main body 3*a*, the outer edge of the semicircular portion overlaps with the outer edge of the main body 3*a*. For example, the curvature of the outer edge of the semi-circular portion is the same as the curvature of the outer edge of the main body 3*a*. The shape of the main body 3*a* of the metal stein 3 may be a shape having a notch in a part of a circle. The semi-circular portion of the end portion 4*d* may have a notch which position corresponds to the position of the notch of the main body 3*a*.

As shown in FIG. 2, the FPC 4 has a signal line 4*h* provided on the bottom surface 4B. The signal line 4*h* extends along the second direction D2. For example, the signal line 4*h* is formed so as to be electrically connectable to the signal pin 3*b*, and transmits the electrical signal along the second direction D2. The signal line 4*h* is made of, for example, metal. The signal line 4*h* transmits, for example, a high-frequency signal such as 100 Gbps. The signal line 4*h* is formed as a transmission line such as a microstrip line with respect to a ground layer 4*t* described later. The signal line 4*h* is formed at a position spaced apart from an outer edge 4*j* of the FPC 4 in the third direction D3 which is the widthwise direction of the FPC 4. The third direction D3 is a direction crossing both the first direction D1 and the second direction D2. For example, the first direction D1, the second direction D2, and the third direction D3 are orthogonal to each other.

In the third direction D3, the distance from the centerline L1 to the signal line 4*h* is shorter than the distance from the centerline L1 to the outer edge 4*j* of the FPC 4. The centerline L1 is, for example, a straight line passing through the center of the FPC 4 in the third direction D3 and extending along the second direction D2. In FIG. 2, the centerline L1 also passes through the center of the metal stein 3 in the third direction D3, and is a centerline common to the metal stein 3 and the FPC 4. The signal line 4*h* may extend along the centerline L1 of the FPC 4. When the FPC 4 is viewed from the first direction D1, the signal line 4*h* may have overlapping with the centerline L1 of the FPC 4. The signal through-hole 4*b* through which the signal pin 3*b* can pass is provided at one end of the signal line 4*h*. The signal through-hole 4*b* may be provided immediately above the centerline L1. The FPC 4 has a ground through-hole 4*c* through which the ground pin 3*c* can pass. For example, when the FPC 4 is viewed from the first direction D1 (in a plan view of the bottom surface 4B of the FPC 4 from the first direction D1), the ground through-hole 4*c* is provided at a position shifted to the outer edge 4*j* side in the third direction D3 from the centerline L1. For example, the ground through-hole 4*c* may be provided between the outer edge 4*j* and the centerline L1 in the third direction D3.

Figure 3:
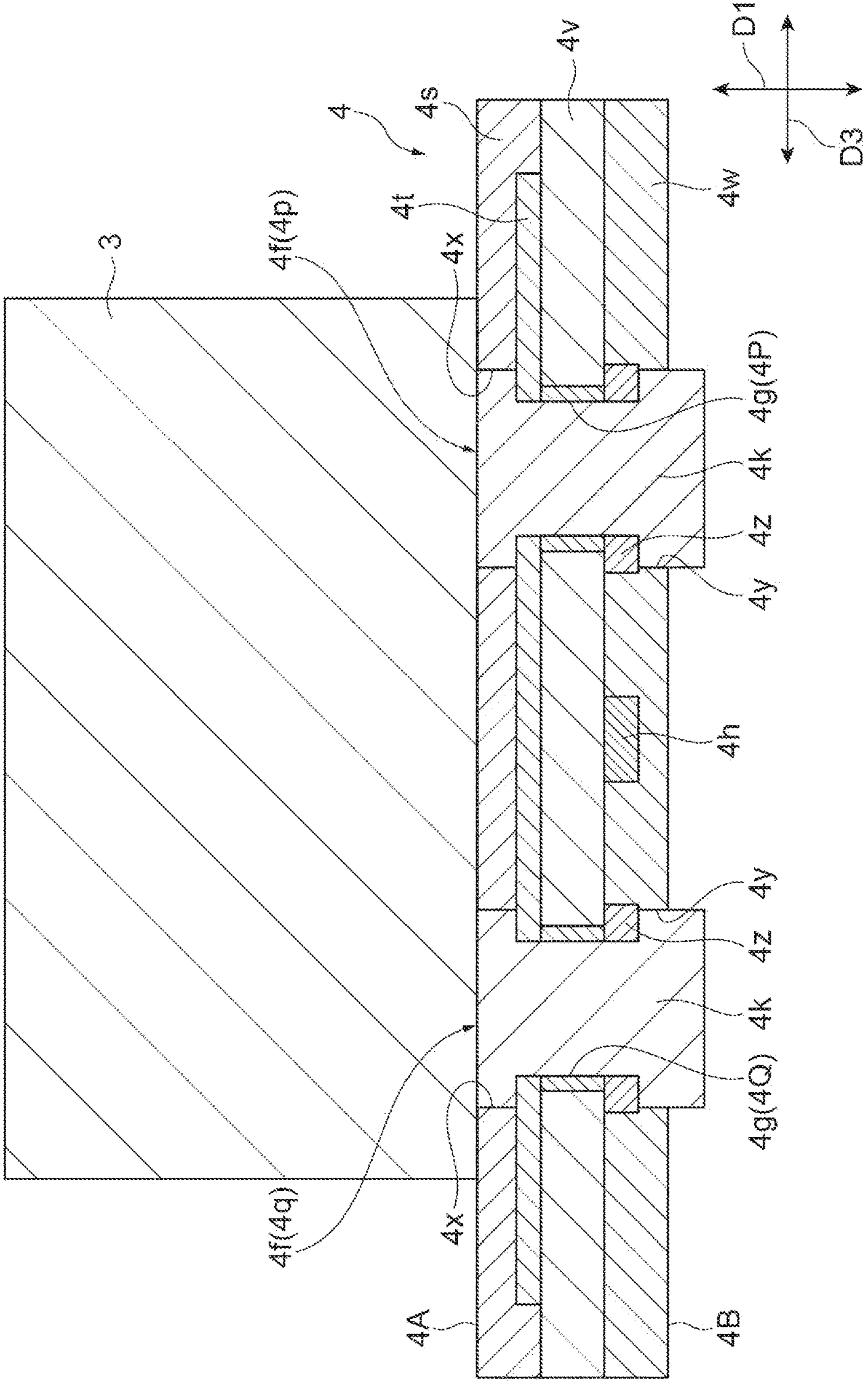
FIG. 3 is a cross-sectional view of III-III line of FIG. 2.

FIG. 3 is a cross-sectional view of III-III line of FIG. 2. As shown in FIGS. 2 and 3, the FPC 4 has a junction part 4*f* for joining the ground layer 4*t* to the metal stein 3. For example, the junction part 4*f* has a circular shape when viewed along the first direction D1 (i.e., in a plan view from the first direction D1). The junction part 4*f* consists of at least an assistance through-hole 4*g* passing through the FPC 4 along the first direction D1, and a solder 4*k* applied to the assistance through-hole 4*g*. The junction part 4*f* may further include the ground layer 4*t* exposed by an opening 4*x* and the solder 4*k* applied to the ground layer 4*t*. The opening 4*x* is provided so as to include the assistance through-hole 4*g* in the plan view from the first direction D1. The assistance through-hole 4*g* is a hole (through-hole) passing through the FPC 4 from the top surface 4A to the bottom surface 4B along the first direction D1. A metal layer is formed on an inner surface of the assistance through-hole 4*g*. For example, the inner surface of the assistance through-hole 4*g* may be plated with copper. Thus, the inside of the assistance through-hole 4*g* is electrically connected to the ground layer 4*t* at the top surface 4A. The ground layer 4*t* is provided around the assistance through-hole 4*g*. In other words, in the plan view from the first direction D1, the assistance through-hole 4*g* is provided inside the ground layer 4*t* visible via the opening 4*x*. The solder 4*k* is also filled inside the assistance through-hole 4*g*. The ground layer 4*t* is joined to the metal stein 3 via the solder 4*k*, and the inside of the assistance through-hole 4*g* is also joined to the metal stein 3 via the solder 4*k*. Since the solder 4*k* is coated on the ground layer 4*t* exposed by the opening 4*x* and is also filled in the assistance through-hole 4*g*, the junction part 4*f* more firmly bonds the FPC 4 to the metal stein 3. The area of each junction part 4*f* when viewed from the first direction D1 is 0.1 $mm^2$ or more and 1.0 $mm^2$ or less. The area of the junction part 4*f* depends on the size of the assistance through-hole and the size of the opening 4*x* included in the junction part 4*f*. For example, the diameter of the assistance through-hole 4*g* may be greater than or equal to 50% and less than or equal to 300% of the diameter of the ground through-hole 4*c*. When the size of the opening 4*x* is larger than the size of the assistance through-hole 4*g*, the area of the junction part 4*f* gets larger as much as the size of the opening 4*x* gets larger than that of the assistance through-hole 4*g*.

The junction part 4*f* is provided inside the metal stein 3 in a plan view of the FPC 4 from the first direction D1. That is, the junction part 4*f* is provided inside a virtual circle C whose center corresponds with the center 3*f* of the signal pin 3*b* when viewed from the first direction D1 and whose outer periphery is in contact with the ground through-hole 4*c*. When viewed from the first direction D1, the distance (first distance) from the junction part 4*f* to the center 3*f* of the signal pin 3*b* is shorter than the distance (the radius R of the virtual circle C) from the ground through-hole 4*c* to the center 3*f* of the signal pin 3*b*. That is, the first distance between the junction part 4*f* and the signal through-hole 4*b* is smaller than a distance between the ground through-hole 4*c* and the signal through-hole 4*b*. The assistance through-hole 4*g* is included in the junction part 4*f* in a plan view from the first direction D1. Therefore, the assistance through-hole 4*g* is provided inside the virtual circle C. Also, the first distance between the assistance through-hole 4*g* and the signal through-hole 4*b* may be smaller than a distance between the ground through-hole 4*c* and the signal through-hole 4*b*.

For example, the optical module 1 includes a plurality of junction parts 4*f*. At least one of the junction parts 4*f* is formed at a position closer to the outer edge 3*g* of the metal stein 3 than the signal through-hole 4*b*. For example, the distance between the junction part 4*f* and the outer edge 3*g* may be smaller than the distance between the signal through-hole 4*b* and the outer edge 3*g*. The plurality of junction parts 4*f* include a first junction part 4*p* and a second junction part 4*q*, and the first junction part 4*p* and the second junction part 4*q* are formed at positions sandwiching the signal line 4*h* in a plan view from the first direction D1. As an example, the first junction part 4*p* and the second junction part 4*q* are arranged at positions line-symmetric to each other with respect to a virtual line extending along the signal line 4*h*. The virtual line may be the centerline L1. For example, the distance between the signal line 4*h* and the first junction part 4*p* extending along the second direction D2 is approximately equal to the distance between the signal line 4*h* and the second junction part 4*q*. Here, 'approximately equal' includes a situation in which two values are different from each other within a range of an allowable manufacturing variation. For example, if a difference between the two distances is within 5% as a relative error of one of the distances, the two distances may be considered to be equal to each other. Each of the first junction part 4*p* and the second junction part 4*q* is formed at a position closer to the outer edge 3*g* of the metal stein 3 than the signal through-hole 4*b*. For example, when viewed along the first direction D1, the distance from the center of the first junction part 4*p* to the outer edge 3*g* of the metal stein 3 may be shorter than the distance from the center of the first junction part 4*p* to the center of the signal through-hole 4*b*. The same applies to the second junction part 4*q*. For example, the plurality of junction parts 4*f* further includes a third junction part 4*r*. The third junction part 4*r* is provided on the side opposite to the signal line 4*h* when viewed from the signal through-hole 4*b*. For example, when viewed along the first direction D1, the third junction part 4*r* is provided between a center 3*j* of the metal stein 3 and the signal pin 3*b* in the second direction D2. The FPC 4 has a plurality of assistance through-holes 4*g* corresponding to the plurality of junction parts 4*f*, respectively. For example, the plurality of assistance through-holes 4*g* may include a first assistance through-hole 4P, a second assistance through-hole 4Q, and a third assistance through-hole 4R. In a plan view from the first direction D1, the first junction part 4*p* includes the first assistance through-hole 4P therein, the second junction part 4*q* includes the second assistance through-hole 4Q therein, and the third junction part 4*r* includes the third assistance through-hole 4R therein.

The FPC 4 includes, for example, a top surface coverlay 4*s*, the ground layer 4*t*, a core (core layer) 4*v*, the signal line 4*h*, and a bottom surface coverlay 4*w*. For example, the top surface coverlay 4*s* and the bottom surface coverlay 4*w* are protective films on the FPC 4, and the core 4*v* is a dielectric layer on the FPC 4. The top surface coverlay 4*s*, the ground layer 4*t*, the core 4*v*, the signal line 4*h*, and the bottom surface coverlay 4*w* are stacked in this order from the top surface 4A toward the bottom surface 4B along the first direction D1. The bottom surface coverlay 4*w*, the signal line 4*h*, the core 4*v*, the ground layer 4*t*, and the top surface coverlay 4*w* may be alternatively stacked in this order from the bottom surface 4B toward the top surface 4B along the first direction D1. The ground layer 4*t* is a layer that gives a reference potential of an electrical signal transmitted by the signal line 4*h*, and is formed between the signal line 4*h* and the metal stein 3 in the first direction D1. The ground layer 4*t* is formed as part of the first wiring layer. The first wiring layer is a thin film formed by a conductive metal between the top surface coverlay 4*s* and the core 4*v*. The top surface coverlay 4*s* protects the electrical wiring formed by the first wiring layer. The top surface coverlay 4*s* covers the electric wiring formed by the first wiring layer, and covers the core 4*v* in a portion where the electric wiring is not formed. Further, the signal line 4*h* is formed as a part of the second wiring layer. The second wiring layer is a thin film formed by a conductive metal between the bottom surface coverlay 4*w* and the core 4*v*. The bottom surface coverlay 4*w* protects the electrical wiring formed in the second wiring layer. The bottom surface coverlay 4*w* covers the electrical wiring formed by the second wiring layer, and covers the core 4*v* in a portion where the electrical wiring is not formed. The signal line 4*h*, the core 4*v*, and the ground layer 4*t* may configure a transmission line.

When the FPC 4 is viewed along the first direction D1, the ground layer 4*t* may extend in the second direction D2 and the third direction D3 to have the same shape as the outer shape of the FPC 4. That is, the ground layer 4*t* may be provided as a so-called solid pattern in a multilayer wiring substrate. A space is provided between the ground layer 4*t* and the signal pin 3*b* so that the signal pin 3*b* is not in contact with the ground layer 4*t*. The ground layer 4*t* is, for example, a thin film formed of a conductive metal. The signal pin 3*b* is insulated from the ground layer 4*t* by the space.

The assistance through-hole 4*g* is configured to pierce the FPC 4, namely all of the top surface coverlay 4*s*, the ground layer 4*t*, the core 4*v*, and the bottom surface coverlay 4*w* in the first direction D1. The assistance through-hole 4*g* has the opening 4*x* formed in the top surface coverlay 4*s* on the top surface 4A and an opening 4*y* formed in the bottom surface coverlay 4*w* on the bottom surface 4B. The ground layer 4*t* around the assistance through-hole 4*g* is exposed from the top surface coverlay 4*s* through the opening 4*x*. The assistance through-hole 4*g* has a land 4*z* inside the opening 4*y* on the bottom surface 4B. The land 4*z* is a thin film formed of a conductive metal. The land 4*z* is exposed from the bottom surface coverlay 4*w* through the opening 4*y*. The land 4*z* is formed as a part of the second wiring layer, for example. The land 4*z* is formed so as to surround the outside of the assistance through-hole 4*g* in a plan view of the FPC 4. The land 4*z* is electrically connected to the metal film formed on the inner surface of the assistance through-hole 4*g*, thereby being electrically connected to the ground layer 4*t*. The solder 4*k* is applied to the ground layer 4*t* exposed by the opening 4*x* and the land 4*z* exposed by the opening 4*y*, and the solder 4*k* is filled in the assistance through-hole 4*g* to form the junction part 4*f*. The solder 4*k* is melted by heating and bonded to each of the main body 3*a* of the metallic stein 3, the ground layer 4*t*, and the metallic film of the assistance through-hole 4*g*, whereby the main body 3*a* and the FPC 4 are firmly connected to each other. At this time, the main body 3*a* is electrically connected to the ground layer 4*t* through the solder 4*k*. That is, the FPC 4 electrically connects the ground layer 4*t* to the metal stein 3 via the junction part 4*f*. The junction part 4*f* electrically connects the ground layer 4*t* and the metal stein 3 to each other. The junction part 4*f* joins the FPC 4 to the metal stein 3 by the solder 4*k* filled in the opening 4*x* and the assistance through-hole 4*g*.

Next, the effects obtained from the optical module 1 according to the embodiment of the present disclosure will be described. In the optical module 1, the FPC 4 has a junction part 4*f* for connecting the ground layer 4*t* to the metal stein 3, and the ground layer 4*t* and the metal stein 3 are electrically joined to each other via the junction part 4*f*. In addition, the FPC 4 is mechanically firmly attached to the metal stein 3 by the junction part 4*f*. When viewed from a first direction D1 in which the signal pin 3*b* extends, the assistance through-hole 4*g* is provided inside the metal stein 3, and a first distance between the assistance through-hole 4*g* and the signal through-hole 4*b* is smaller than a distance between the ground through-hole 4*c* and the signal through-hole 4*b*.

Incidentally, for example, when a high-speed electrical signal is transmitted from the signal line 4*h* to the signal pin 3*b*, a return current generated with the transmission of the electrical signal returns from the ground layer 4*t* to the signal source. For example, when the optical semiconductor element 2 is a laser diode, the electrical signal may be a drive signal for driving the laser diode at high speed, and the signal source may be a drive circuit for outputting the drive signal. In the optical module 1, since the junction part 4*f* is provided closer to the signal pin 3*b* than the ground through-hole 4*c*, the ground is reinforced and the return current flows closer to the signal line 4*h*. Therefore, the parasitic inductance and parasitic capacitance between the ground layer 4*t* and the metal stein 3 are reduced by the ground reinforcement, and a resonance phenomenon due to the return current flows and the parasitic capacitance is suppressed, so that the frequency response characteristic of the electrical signal can be improved up to a higher frequency. Such broadening of the frequency response characteristic (bandwidth) of the optical module 1 is preferable for improving the performance of the optical transmission device.

The junction part 4*f* may be formed at a position closer to the outer edge 3*g* of the metal stein 3 than the signal through-hole 4*b* in the FPC 4 plan view. In this case, by providing the junction part 4*f* joining the metal stein 3 and the ground layer 4*t* to each other at a position closer to the outer edge 3*g* of the metal stein 3, for example, the mechanical strength of the optical module 1 against bending along the first direction of the FPC 4 can be increased, so that the possibility of disconnection of the signal line 4*h* due to bending stresses can be reduced.

The junction part 4*f* may include the first junction part 4*p* and the second junction part 4*q*, and the first junction part 4*p* and the second junction part 4*q* may be formed to sandwich the signal line 4*h* in a plan view of the FPC 4. In this case, since the first junction part 4*p* and the second junction part 4*q* are formed so as to sandwich the signal line 4*h*, the return current flows in the vicinity of the signal line 4*h* by the first junction part 4*p* and the second junction part 4*q*. In addition, since the number of junction parts is increased, the FPC 4 can be mechanically more firmly fixed to the metal stein 3. Thus, the mechanical resistance of the optical module 1 against bending stress can be improved.

By the way, the above-described electrical reinforcement of the ground and strengthening of the mechanical strength can be expected to be more effective by increasing the area of the junction part 4*f*. However, when the area of the junction part 4*f* is increased, the required amount of the solder 4*k* to form the junction part 4*f* is increased, and a larger amount of heat is required to heat and melt the solder 4*k*. Since heat is also conducted to the metal stein 3 due to heating of the solder 4*k*, the amount of the solder 4*k* is preferably small in order to reduce thermal influence on the metal stein 3 on which the optical semiconductor element 2 is mounted.

The junction part 4*f* may be connected to the metal stein 3 by the solder 4*k*, and an area of the solder 4*k* in the junction part 4*f* when viewed from the first direction D1 may be not less than 0.1 $mm^2$ and not more than 1.0 $mm^2$ per junction part 4*f*. As a result, it is possible to suppress the thermal influence of the heating of the solder 4*k* on the metal stein 3 and to sufficiently reinforce the ground and the mechanical strength. Since the solder 4*k* is filled in the assistance through-hole 4*g*, heat can be efficiently transmitted to the solder 4*k* at a portion in contact with the metal stein 3, for example, by applying a solder iron to the solder 4*k* from the side of the bottom surface 4B of the FPC 4. As a result, the heating time required for melting the solder 4*k* can be shortened and the thermal influence on the metal stein 3 can be reduced.

Figure 4:
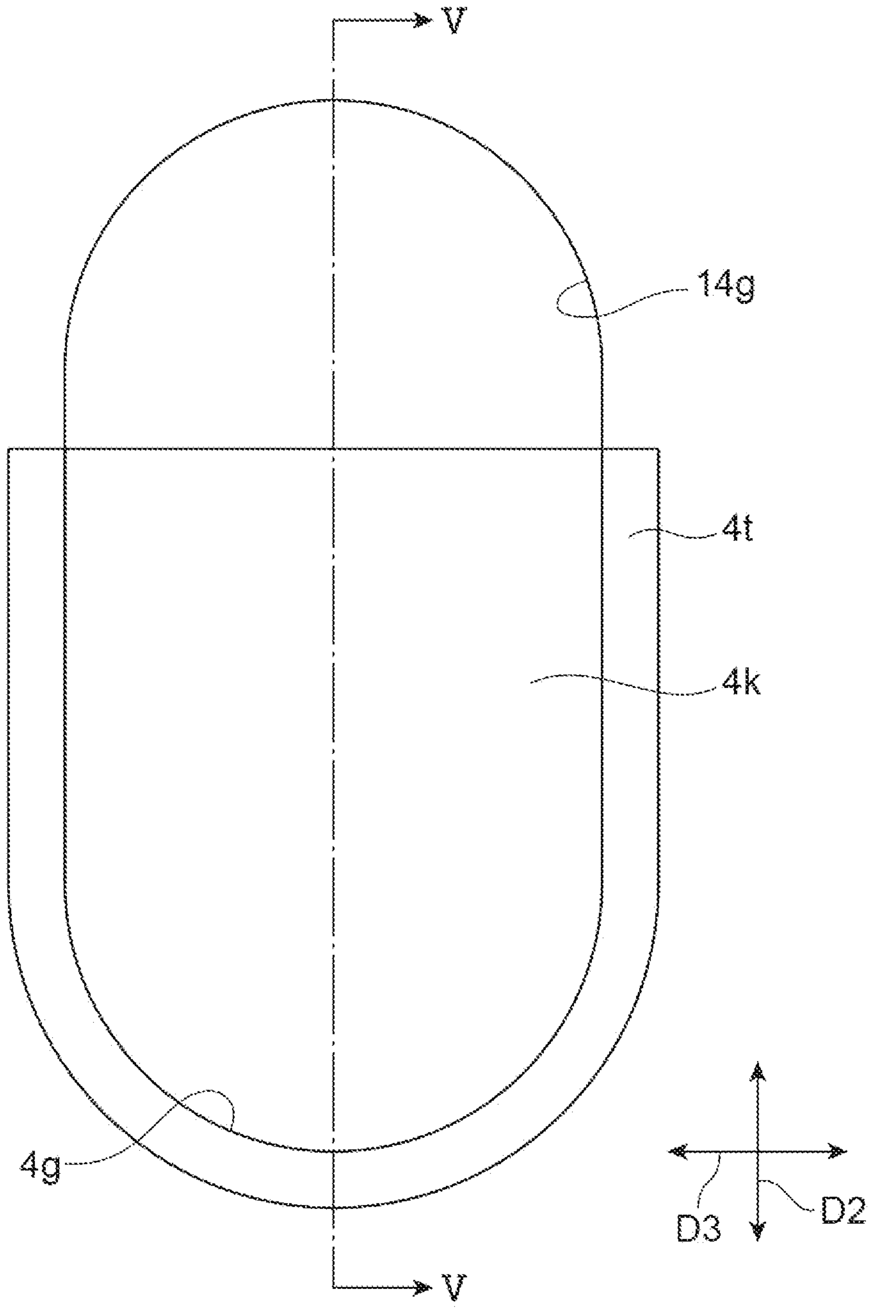
FIG. 4 illustrates an example of an assistance through-hole.

In the first embodiment, an example in which the shape of the assistance through-hole 4*g* configuring the junction part 4*f* when viewed along the first direction D1 is a circular shape has been described above. However, the shape of the assistance through-hole is not limited to a circular shape, and may be an elliptical shape, an oval shape, an arc shape, or a polygonal shape, and can be appropriately changed. For example, as shown in FIG. 4 which is a modification, the FPC may have an assistance through-hole 4*g* having a shape extending in one direction. The assistance through-hole 4*g* has a shape extending in the second direction D2. For example, the assistance through-hole 4*g* may have an oval shape and may have a major axis extending along the second direction D2. The length of the assistance through-hole 4*g* in the second direction D2 may be greater than the length (width) of the assistance through-hole 4*g* in the third direction D3. Further, the assistance through-hole 4*g* may have a portion in which the ground layer 4*t* is not exposed around the assistance through-hole 4*g*. This portion corresponds to a non-filling portion 14*g* to which the solder 4*k* is not applied. For example, the non-filling portion 14*g* may be provided at one side of the assistance through-hole 4*g* in the long axis direction.

As described above, in the case of the assistance through-hole 4*g* according to the modification, the assistance through-hole 4*g* has a shape extending in one direction, that is, a shape extending in the second direction D2. Such an assistance through-hole 4*g* allows a worker to easily inspect the finished condition of the solder 4*k* partially filled in the assistance through-hole 4*g*. Further, if the assistance through-hole 4*g* has the non-filling portion 14*g*, when the solder 4*k* is applied between the exposed ground layer 4*t* around the assistance through-hole 4*g* and the main body 3*a* of the metal stein 3 and the exposed ground layer 4*t* is bonded to the main body 3*a* by melting the solder 4*k*, the amount of the solder 4*k* and the finished condition of shape formed between the metal stein 3 and the ground layer 4*t* in the junction part 4*f* can be visually inspected with the naked eye or a microscope through the non-filling portion 14*g* where the solder 4*k* is not applied from the bottom surface 4B.

In the case of a junction part 14*f* to be described later, a portion covered by the coverlay 4*w* corresponds to a non-filling portion to which solder is not applied. The relationship between the non-filling portion and the land 4*z* will be described later. The same effect as that of the junction part 4*f* can be obtained from the junction part 14*f*.

Figure 5:
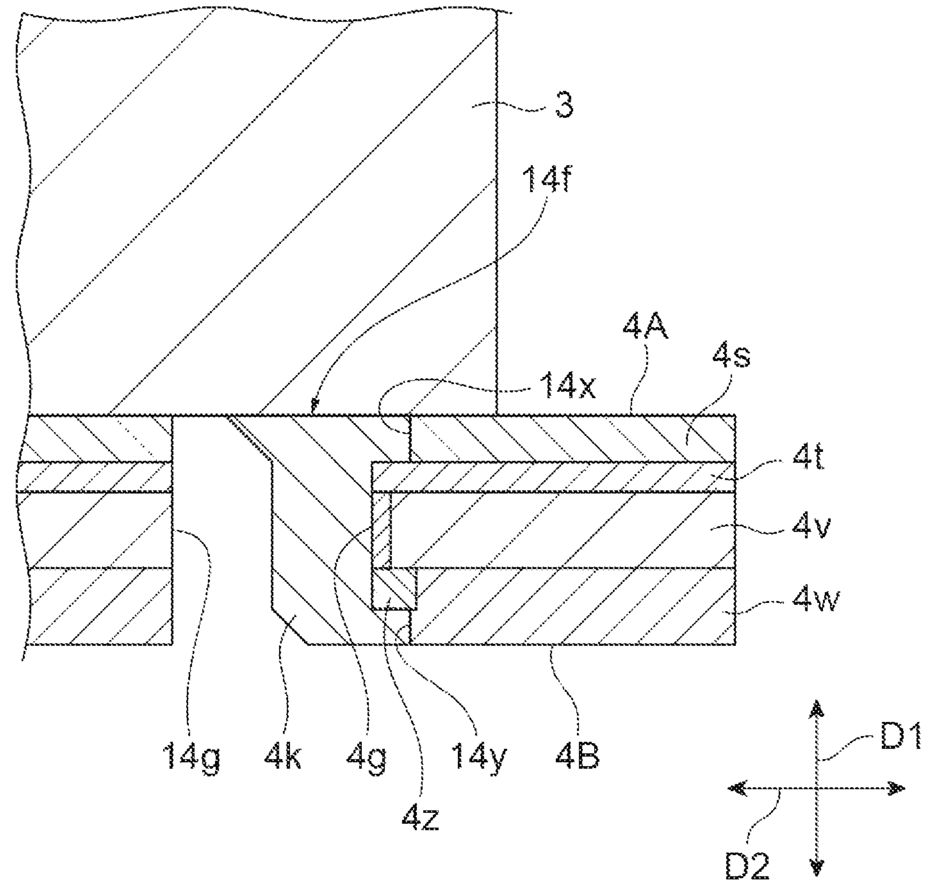
FIG. 5 illustrates an example of an assistance through-hole different from FIG. 4.

FIG. 5 is a cross-sectional view taken along line V-V of FIG. 4. The assistance through-hole 4*g* extends along the second direction D2. FIG. 5 shows a state in which the FPC 4 is attached to the metal stein 3 by the junction part 14*f* formed in the assistance through-hole 4*g*. In an opening 14*x*, the top surface coverlay 4*s* covers the ground layer 4*t* adjacent to the non-filling portion 14*g*, and only the ground layer 4*t* of the other portion (soldered portion) is exposed from the top surface coverlay 4*s*. The land 4*z* is not formed in a portion adjacent to the non-filling portion 14*g* and is formed only in the soldered portion. Although the land 4*z* is formed to surround the assistance through-hole 4*g* in the first embodiment shown in FIG. 3, the land 4*z* is formed to surround only a portion of the assistance through-hole 4*g* in FIGS. 4 and 5. In addition, in the assistance through-hole 4*g*, a portion adjacent to the non-filling portion 14*g* is not plated, and only a soldered portion is plated. Thus, the solder 4*k* is not wettable to the non-filling portion 14*g*. The solder 4*k* is applied to the ground layer 4*t* exposed by the opening 14*x*, a part (filling portion) of the assistance through-hole 4*g*, and the land 4*z*, and is melted by heating to form the junction part 14*f*. Accordingly, the junction part 14*f* is formed only at one end of the assistance through-hole 4*g* in the second direction D2. The finished condition of the junction part 14*f* can be visually inspected through the other end to which the solder 4*k* is not applied. For example, the amount of the solder 4*k* and the wettability of the solder 4*k* with the metal stein 3 can be inspected. The land 4*z* may be formed at a portion adjacent to the non-filling portion 14*g*, and an inner front portion of the assistance through-hole 4*g* may be plated. For example, even when the land 4*z* and the assistance through-hole 4*g* are formed as described above, by forming the assistance through-hole 4*g* having a shape sufficiently long in the second direction D2 by making the length in the major axis direction twice or more the length in the minor axis direction (the third direction D3), it is possible to form the junction part 14*f* in which the solder 4*k* is applied to only one end inside the assistance through-hole 4*g*. A small-size assistance through-hole 4*g* provides a small-size non-filling portion 14*g*, which may be less useful for the above described visual inspection. Not forming the land 4*z* at the portion adjacent the non-filling portion 14*g* and not plating the inner front portion of the assistance through-hole 4*g* help such a small-size non-filling portion 14*g* to get larger.

Second Embodiment

Figure 6:
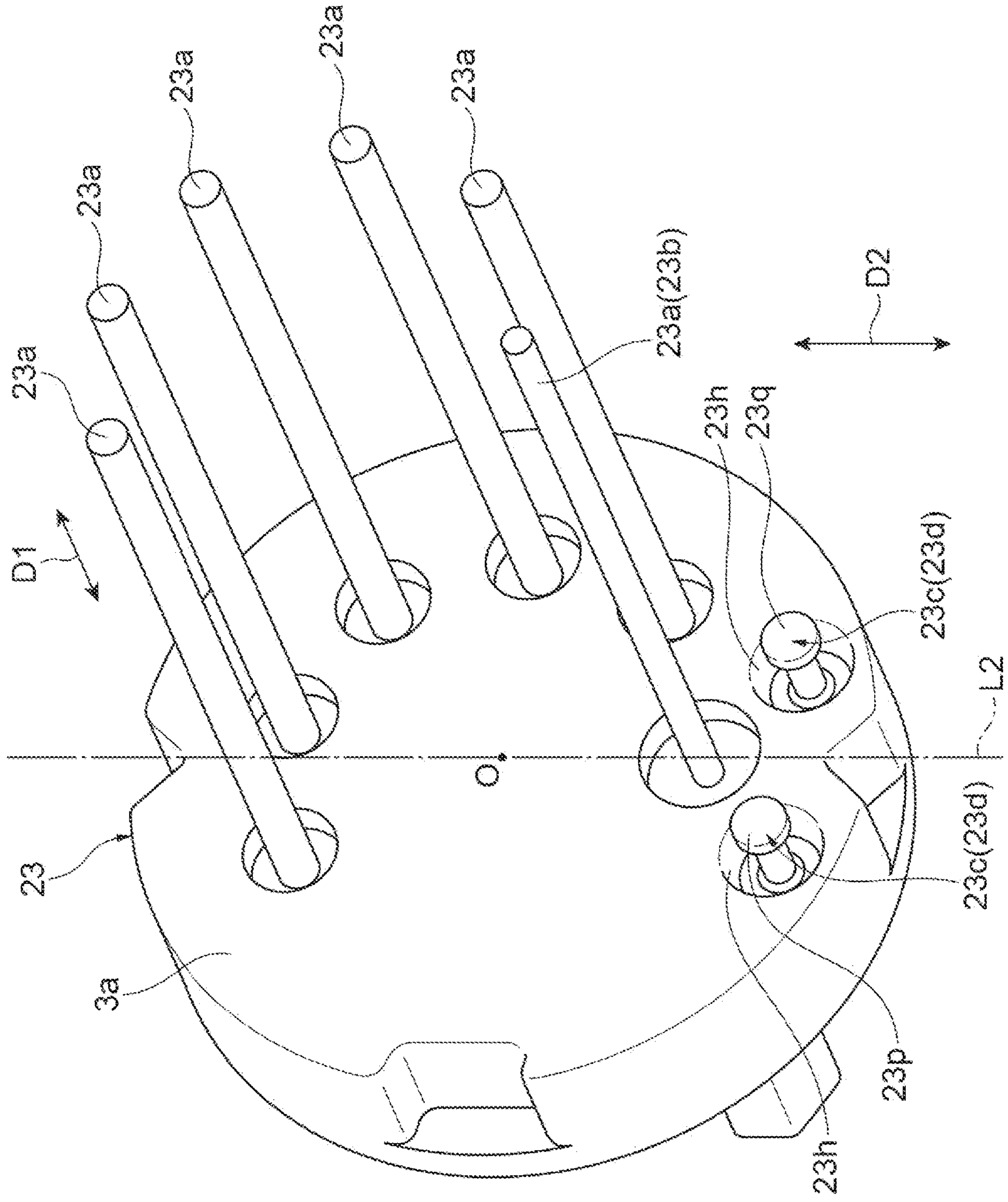
FIG. 6 is a perspective view showing a metal stein of an optical module according to a second embodiment.

Next, an optical module according to a second embodiment will be described. Some configurations of the optical module according to the second embodiment are the same as some configurations of the above-described optical module 1. Therefore, in the following description, the description overlapping with the description of the optical module 1 is denoted by the same reference numerals and is appropriately omitted. Referring to FIG. 6, an optical module according to the second embodiment includes a plurality of metallized pins 23*a*. The metallized pins 23*a* may include a signal pin 23*b* and a ground pin 23*c*. For example, a metal stein 23 has a plurality of ground pins 23*c*. Two of the ground pins 23*c* are formed, for example, at two respective positions sandwiching a centerline L2 in a plan view of the outer surface 3B of the main body 3*a*. The centerline L2 is a straight line passing through the center O of the metal stein 23 and the signal pin 23*b* and extending in the second direction D2. As an example, the plurality of ground pins 23*c* are formed at positions line-symmetric to each other with respect to the centerline L2 in a plan view of the outer surface 3B of the main body 3*a*. For example, the two ground pins 23*c* are arranged such that when a virtual straight line passing through the centers of the ground pins 23*c* is orthogonal to the centerline L2, the distances of the centers of the ground pins 23*c* from the centerline L2 are equal to each other. The centerline L2 extends, for example, along the second direction D2.

Figure 7:
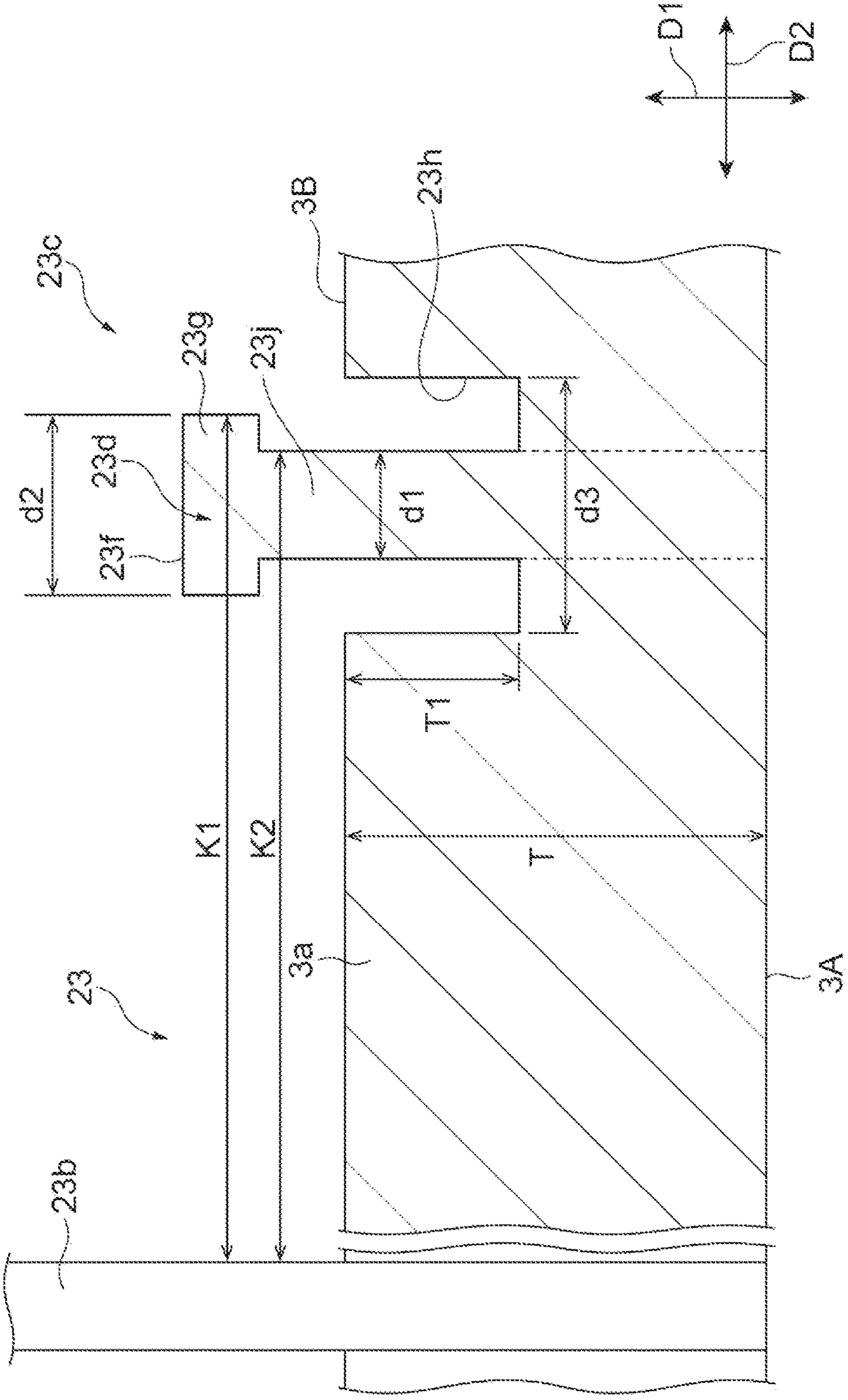
FIG. 7 is a cross-sectional view showing a flat head of a protrusion of the metal stein of FIG. 6.
Figure 8:
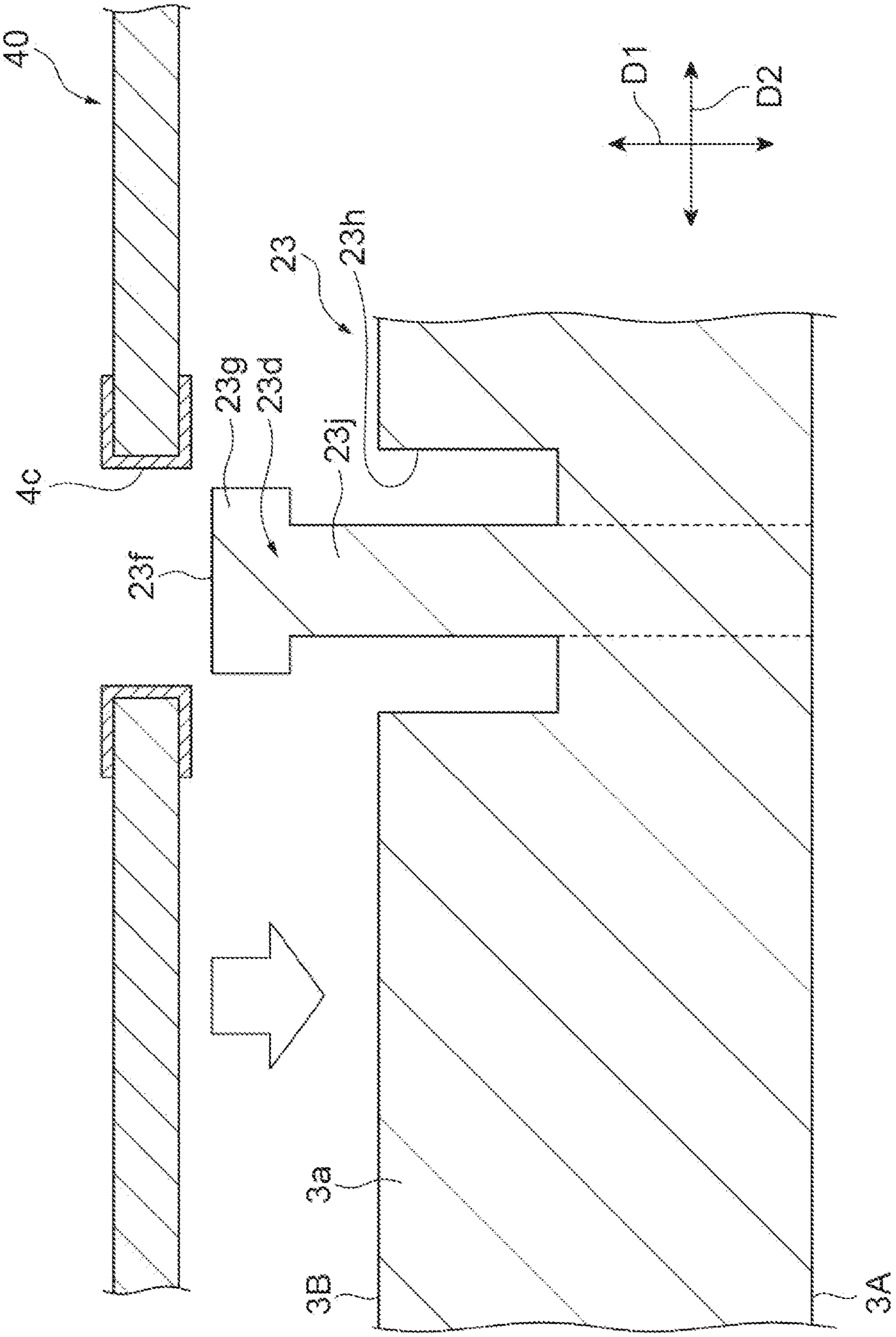
FIG. 8 illustrates a step of a method of manufacturing an optical module according to an embodiment.
Figure 9:
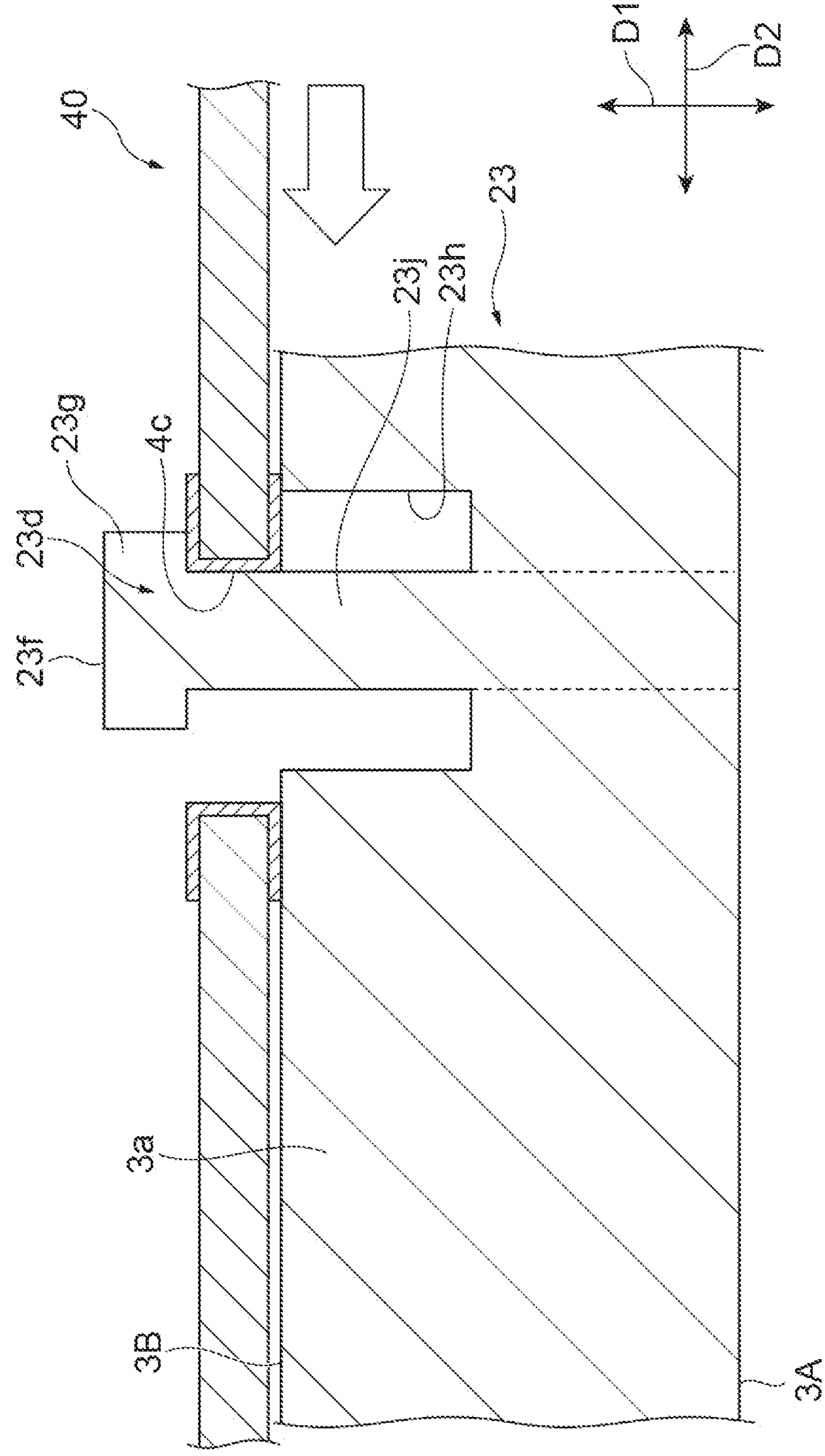
FIG. 9 illustrates a step of a method of manufacturing the optical module according to the embodiment.
Figure 10:
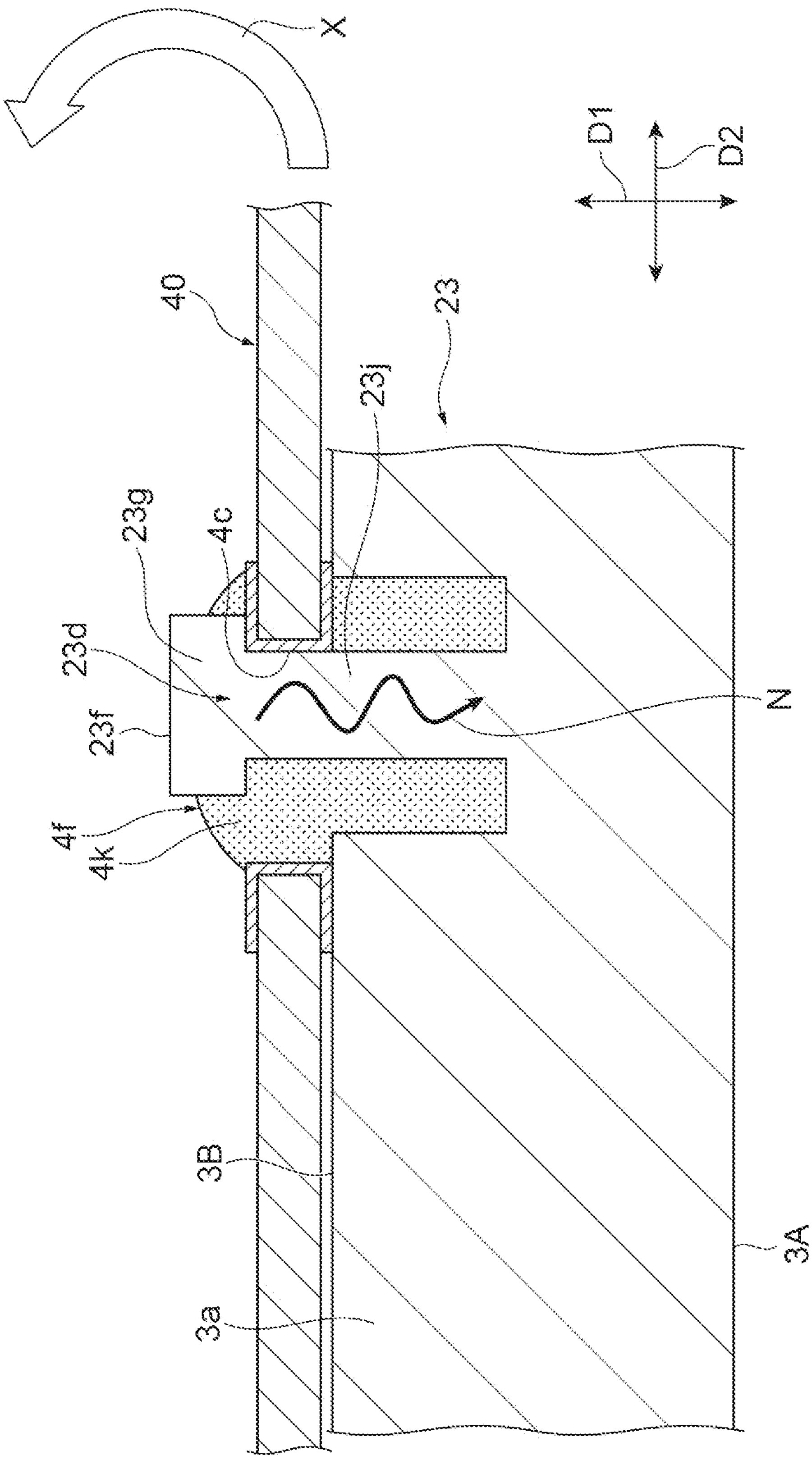
FIG. 10 illustrates a step of a method of manufacturing the optical module according to the embodiment.

FIG. 7 is a cross-sectional view of the metal stein 23 showing ground pin 23*c*. As shown in FIGS. 6 and 7, the metal stein 23 has a protrusion 23*d* protruding from the main body 3*a* of the metal stein 23 in the first direction D1 and a hollow 23*h* surrounding the protrusion 23*d*. The protrusion 23*d* functions as the ground pin 23*c*. For example, the metal stein 23 has a plurality of protrusions 23*d*, and the plurality of protrusions 23*d* include a first protruding portion 23*p* and a second protruding portion 23*q*. An FPC 40 is connected to the metal stein 23 as shown in FIGS. 8, 9, and 10. The FPC 40 has the ground through-hole 4*c* that includes a first ground through-hole 4P and a second ground through-hole 4Q, similar to the above-described FPC 4. In other words, the FPC 40 is, for example, the same as the FPC 4 except that the FPC 40 has the first ground through-hole 4P at the position of the first junction part 4*p* and the second ground through-hole 4Q at the position of the second junction part 4*q* shown in FIG. 2. The FPC 40 may further have a plurality of through holes corresponding to the metallized pins 23*a* shown in FIG. 6. Setting the outer diameter of the first ground through-hole 4P larger than the outer diameter of the first protruding portion 23*p* allows the first protruding portion 23*p* to pass through the first ground through-hole 4P. Similarly, setting the outer diameter of the second ground through-hole 4Q larger than the outer diameter of the second protruding portion 23*q* allows the second protruding portion 23*q* to pass through the second ground through-hole 4Q.

For example, each of the protrusion 23*d* and the hollow 23*h* has a cylindrical shape extending along the first direction D1. However, the protrusion 23*d* may have a shape other than the cylindrical shape, and may have, for example, a prismatic shape such as a quadrangular prism shape or a columnar shape having an oval bottom surface. The shape of the hollow 23*h* can also be changed as appropriate. The protrusion 23*d* passes through (pierces) the ground through-hole 4*c* of the FPC 40 when the FPC 40 is attached to the metal stein 23 (see FIG. 10). The protrusion 23*d* has a flat head 23*g* having a top surface side 23*f* intersecting the first direction D1 at the tip of the protrusion 23*d*. The top surface 23*f* is a flat surface, for example extending along a plane orthogonal to the first direction D1. That is, the top surface 23*f* extends in the second direction D2 and the third direction D3. The top surface 23*f* may be parallel with an outer surface 3B of the metal stein 23.

The flat head 23*g* has a diameter d2 greater than the diameter d1 of the base 23*j* of the protrusion 23*d*. For example, the length (maximum value) of the flat head 23*g* in the second direction D2 may be larger than the length (maximum value) of base 23*j* in the second direction D2. As an example, the diameter D1 of the base 23*j* is greater than or equal to 0.2 mm and less than or equal to 0.3 mm. The diameter d2 of the flat head 23*g* is, for example, not less than 1.5 times and not more than 2.5 times (for example, about twice) the diameter d1 of the base 23*j*. When viewed along the first direction D1, the diameter d3 of the hollow 23*h* is, for example, not less than 1.5 times and not more than 2.5 times (for example, about 2 times) the diameter d1 of the base 23*j*. As an example, the diameter d3 of the hollow 23*h* may be greater than the diameter d2 of the flat head 23*g*. For example, the length (depth) T1 of the hollow 23*h* in the first direction D1 may be ¼ or more and ¾ or less of the length (thickness) T of the main body 3*a* of the metal stein 23 in the first direction D1.

For example, as illustrated in FIG. 7, the protrusion 23*d* has a T-shape in which a flat head 23*g* provided at an upper end of a base 23*j* has both sides each extending outside along the second direction D2 in a cross-sectional view along the second direction D2. However, the protrusion 23*d* may have an L-shape in which the flat head provided at the upper end of the base has only one side extending outside along the second direction D2. For example, a distance K1 (third distance) between the signal pin 23*b* and the far end of the flat head 23*g* from the signal pin 23*b* in the second direction D2 may be set greater than a distance K2 (fourth distance) between the signal pin 23*b* and the far end of the base 23*j* of the protrusion 23*d* from the signal pin 23*b* in the second direction D2. In this case, the ground through-hole 4*x* of the FPC 40 can be hooked to the flat head 23*g* at the upper end of the base 23*j*. It is noted that the inside diameter of the ground through-hole 4*c* of the FPC 40 should be larger than the outside diameter d2 of the flat head 23*g* of the metal stein 23.

Next, a method of manufacturing the optical module according to the embodiment will be described with reference to FIGS. 8, 9 and 10. First, as shown in FIG. 8, a ground through-hole 4*c* is provided in the FPC 40. At this time, the ground through-hole 4*c* penetrating the FPC 40 along the first direction D1 is formed in the FPC 40 (a step of forming a ground through-hole). Next, the protrusion 23*d* of the metal stein 23 is inserted into the ground through-hole 4*c*. Then, as shown in FIG. 9, an edge of the ground through-hole 4*c* is hooked on the flat head 23*g* formed on the tip of the protrusion 23*d* (step of hooking the edge of the ground through-hole). For example, the FPC 40 through which the protrusion 23*d* is inserted is slid along the second direction D2 to bring an inner side of the ground through-hole 4*c* into contact with the base 23*j* of the protrusion 23*d*. Thereafter, as shown in FIG. 10, the solder 4*k* is applied to the hollow 23*h* and the protrusion 23*d* in a state where the edge of the ground through-hole 4*c* is caught by the flat head 23*g* (applying step). Then, heat N is applied to the solder 4*k* via the protrusion 23*d*. For example, the solder 4*k* is heated by bringing a solder iron into contact with the top surface side 23*f* of the flat head 23*g*. The solder 4*k* filled and melted in the hollow 23*h* forms junction among the base 23*j* and the flat head 23*g* of the protrusion 23*d* and the ground through-hole 4*c*. As a result, the metal stein 23 and the ground layer 4*t* of the FPC 40 are joined to each other by the solder 4*k* after cooling down, and a series of steps is completed.

Next, operational effects of the optical module according to the second embodiment will be described. In the optical module according to the second embodiment, the metal stein 23 has a protrusion 23*d* penetrating the ground through-hole 4*c* of the FPC 40. Therefore, since the metal stein 23 has the protrusion 23*d* passing through the ground through-hole 4*c*, when the FPC 40 is connected to the metal stein 23 by the solder 4*k*, the protrusion 23*d* can be efficiently heated by using a heating tool such as a solder iron. Efficient heating by the protrusion 23*d* at the time of melting the solder 4*k* reduces excessive heat conduction to the periphery of the hollow 23*h* and prevents the entire metal stein 23 from reaching a high temperature, so that the heating of the solder 4*k* can be performed for a short time. The high temperature and long heating may cause misalignment of the optical semiconductor element 2.

The protrusion 23*d* may have a flat head 23*g* at the tip of the protrusion 23*d* that has a top surface 23*f* that intersects the first direction D1. In this case, when the flat head 23*g* of the protrusion 23*d* is heated at the time of melting the solder 4*k*, heat can be efficiently transferred to the solder 4*k* filled between the base 23*j* and the hollow 23*h*.

The metal stein 23 may further include a hollow 23*h* surrounding the protrusion 23*d*. Since, for example, the solder 4*k* enters the hollow 23*h*, heat is transferred mainly to the solder 4*k* via the base 23*j*, and heat conduction to the metal stein 23 is reduced. Therefore, in this case, when the protrusion 23*d* is heated by the solder iron, the hollow 23*h* formed around the protrusion 23*d* reduces excessive heat conduction to a portion other than the hollow 23*h* of the metal stein 23. More specifically, the heat of the base 23*j* is primarily transferred to the solder 4*k* and then transferred to the outside of the hollow 23*h*. Therefore, the solder 4*k* can be efficiently heated, and the entire metal stein 23 can be more reliably prevented from reaching a high temperature. Thus, the protrusion 23*d* and the hollow 23*h* enable effective heating of the solder 4*k* and reduce the thermal influence on the metal stein 23.

The flat head 23*g* may have a diameter greater than a diameter of the base 23*j* of the protrusion 23*d*. In this case, since the edge of the ground through-hole 4*c* of the FPC 40 can be caught by the flat head 23*g*, the resistance (holding force) of the FPC 40 against the force X bending the FPC in the direction away from the metal stein 23 can be further enhanced. The ground through-hole 4*c* of the FPC 40 caught by the flat head 23*g* of the protrusion 23*d* brings a strong anchor effect. The resistance to the bending force X is greatly strengthened by the anchor effect. The anchor effect is obtained by the fact that the force required to deform the flat head 23*g* and peel off the FPC 40 becomes larger than the force required to peel off the FPC against the joining force of the solder 4*k*. The anchor effect is expected to be strengthened by increasing the diameter d2 of the flat head 23*d* relative to the diameter d1 of the base 23*j*.

The distance K1 between the signal pin 23*b* and the far end of the flat head 23*g* from the signal pin 23*b* in the second direction D2 may be greater than the distance K2 between the signal pin 23*b* and the far end of the base 23*j* of the protrusion 23*d* from the signal pin 23*b* in the second direction D2. In this case, since the distance K1 from the signal pin 23*b* to the far end of the flat head 23*g* is greater than the distance K2 from the signal pin 23*b* to the far end of the base 23*j* of the protrusion 23*d*, the edge of the ground through-hole 4*c* of the FPC 40 through which the protrusion 23*d* is inserted may be caught by the flat head 23*g*.

The ground through-hole 4*c* may include a first ground through-hole 4P and a second ground through-hole 4Q. In the plan view of the FPC 40, the first ground through-hole 4P and the second ground through-hole 4Q may be formed to sandwich the signal line 4*h*. The protrusion 23*d* may include a first protruding portion 23*p* and a second protruding portion 23*q*. The first protruding portion 23*p* may pass through the first ground through-hole 4P, and the second protruding portion 23*q* may pass through the second ground through-hole 4Q. The protrusion 23*d* may be formed as a part of the main body 3*a* of the metal stein 3, and may be configured by a conductive material and electrically and mechanically connected to the main body 3*a*. Accordingly, the protrusion 23*d* may be configured to provide a reference potential. In this case, since the first ground through-hole 4P and the second ground through-hole 4Q are arranged so as to sandwich the signal line 4*h* in the plan view of the FPC 40, the return current flows near the signal line 4*h* due to the first ground through-hole 4P and the second ground through-hole 4Q. Therefore, the frequency-response characteristics related to the signal line 4*h* can be further improved. In this case, the first protruding portion 23*p* and the second protruding portion 23*q* may be used as the ground pin 23*c*.

Further, in the method of manufacturing the optical module according to the embodiment, the ground through-hole 4*c* passing through the FPC 40 along the first direction D1 may be formed, and an edge of the ground through-hole 4*c* may be caught by the flat head 23*g* in a state in which the protrusion 23*d* is inserted into the ground through-hole 4*c*. Since the solder 4*k* is applied to the hollow 23*h* formed around the protrusion 23*d* in this state, it is possible to easily and firmly connect the FPC 40 to the metal stein 23.

Various embodiments and modifications of optical modules and methods of making optical modules according to the present disclosure have been described above. However, the present invention is not limited to the embodiments or modifications described above. That is, it is easily recognized by those skilled in the art that various modifications and changes can be made to the present invention within the scope of the gist described in the claims.

For example, in the above-described embodiment, the solder 4*k* is filled in the assistance through-hole 4*g* that electrically connects the ground layer 4*t* to the metal stein 3. However, for example, the ground layer 4*t* may be electrically connected to the metal stein 3 by a conductive adhesive instead of the solder 4*k*. In the above-described embodiment, an example has been described in which the optical semiconductor element 2 is the optical module 1 that is an optical transmission module that outputs an optical signal, and the signal pin 3*b* transmits an electrical signal to the optical semiconductor element 2. However, the optical module according to the present disclosure may be an optical receiver module in which a signal pin transmits an electrical signal output from an optical semiconductor element 2. For example, the optical semiconductor element 2 may include a light receiving element (for example, a photodiode), an optical signal incident on the lens R from the outside may be condensed and incident on the light receiving element, and the optical semiconductor element 2 may convert the incident optical signal into an electrical signal and output the electrical signal. The electrical signal may be transmitted to the signal line 4*h* of the FPC 4 via the signal pin 3*b*.

What is claimed is:

1. An optical module comprising:

an optical semiconductor element;

a stem including a signal pin extending in a first direction and a ground pin, the signal pin being electrically connected to the optical semiconductor element for transmitting an electrical signal, the ground pin being configured to provide a reference potential of the electrical signal; and a circuit board extending in a second direction crossing the first direction, the circuit board including a signal through-hole, a ground through-hole, a signal line extending in the second direction, a ground layer, an assistance through-hole provided within the stem in a planar view of the circuit board from the first direction, and a junction part, the signal through-hole being configured to be pierced by the signal pin, the ground through-hole being configured to be pierced by the ground pin, the signal line being configured to be electrically connected with the signal pin, the ground layer being configured to be electrically connected with the ground pin, the junction part being configured to connect the assistance through-hole and the ground layer around the assistance through-hole with the stem;

wherein the circuit board has a first distance between the assistance through-hole and the signal through-hole, the first distance being smaller than a second distance between the ground through-hole and the signal through-hole.

2. The optical module according to claim 1, wherein the junction part is provided between the signal through-hole and an outer edge of the stem in the planar view.

3. The optical module according to claim 1, wherein the junction part includes a first junction part and a second junction part, and the signal line is sandwiched between the first junction part and the second junction part in a third direction crossing the first direction and the second direction.

4. The optical module according to claim 1, wherein the assistance through-hole has a shape extending in a direction.

5. The optical module according to claim 4, wherein the junction part is joined to the stem with a solder or a conductive adhesive, and the assistance through-hole has a non-filling portion not filled with the solder nor the conductive adhesive.

6. The optical module according to claim 1, wherein the junction part is joined to the stem with a solder or a conductive adhesive, and the junction part has an area 0.1 $mm^2$ or larger and 1.0 $mm^2$ or smaller in the planar view.

7. An optical module comprising:

an optical semiconductor element;

a stem including a signal pin extending in a first direction and a ground pin, the signal pin being electrically connected to the optical semiconductor element for transmitting an electrical signal, the ground pin being configured to provide a reference potential of the electrical signal, the ground pin having a base and a flat head provided at a tip of the base, the flat head having a top surface crossing the first direction; and a circuit board extending in a second direction crossing the first direction, the circuit board including a signal through-hole, a ground through-hole, a signal line extending in the second direction, and a ground layer, the signal through-hole being configured to be pierced by the signal pin, the ground through-hole being configured to be pierced by the ground pin, the signal line being configured to be electrically connected with the signal pin, the ground layer being configured to be electrically connected with the ground pin, wherein the ground through-hole includes a first ground through-hole and a second ground through-hole, the signal line being sandwiched between the first ground through-hole and the second ground through-hole in a third direction crossing the first direction and the second direction, and the ground pin includes a first ground pin and a second ground pin, the first ground pin piercing the first ground through-hole and the second ground pin piercing the second ground through-hole.

8. The optical module according to claim 7, wherein the stem further has a hollow extending the first direction, the hollow including a protrusion in the planar view, the protrusion extending from the stem in the first direction and having the flat head at a tip of the protrusion.

9. The optical module according to claim 8, wherein the base has a first diameter, and the flat head has a second diameter larger than the first diameter.

10. The optical module according to claim 7, wherein the ground through-hole has a shape extending in the second direction.

11. The optical module according to claim 8, wherein the stem has a third distance from the signal pin to a far end of the flat head and a fourth distance from the signal pin to a far end of the base, the third distance being larger than the fourth distance.

12. A manufacturing method of the optical module according to claim 7, the manufacturing method comprising:

opening a ground through-hole penetrating the circuit board in the first direction;

passing the ground pin through the ground through-hole;

hooking the ground through-hole on the flat head; and applying a solder or a conductive adhesive to the ground pin and a hollow extending in the first direction, the hollow including the ground pin in the planar view, while the ground through-hole is hooked on the flat head.

13. An optical module comprising:

an optical semiconductor element;

a stem including a signal pin extending in a first direction and a ground pin, the signal pin being electrically connected to the optical semiconductor element for transmitting an electrical signal, the ground pin being configured to provide a reference potential of the electrical signal, the ground pin having a base extending from the stem in the first direction and a flat head provided at a tip of the base, the flat head having a top surface crossing the first direction; and a circuit board extending in a second direction crossing the first direction, the circuit board including a signal through-hole, a ground through-hole, a signal line extending in the second direction, and a ground layer, the signal through-hole being configured to be pierced by the signal pin, the ground through-hole being configured to be pierced by the ground pin, the signal line being configured to be electrically connected with the signal pin, the ground layer being configured to be electrically connected with the ground pin, wherein the circuit board is sandwiched between the flat head and an outer surface of the stem in the first direction.

* * * * *